(12) United States Patent
Baek et al.

(10) Patent No.: US 11,557,652 B2
(45) Date of Patent: Jan. 17, 2023

(54) METAL SOURCE/DRAIN-BASED MOSFET AND METHOD FOR FABRICATING THE SAME

(71) Applicant: Samsung Electronics Co., Ltd., Suwon-si (KR)

(72) Inventors: Rock Hyun Baek, Pohang-si (KR); Jun Sik Yoon, Pohang-si (KR); Jin Su Jeong, Daegu (KR); Seung Hwan Lee, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 151 days.

(21) Appl. No.: 16/562,693

(22) Filed: Sep. 6, 2019

(65) Prior Publication Data

US 2020/0098862 A1 Mar. 26, 2020

(30) Foreign Application Priority Data

Sep. 21, 2018 (KR) ........................ 10-2018-0114050

(51) Int. Cl.
*H01L 29/08* (2006.01)
*H01L 29/66* (2006.01)

(52) U.S. Cl.
CPC .... *H01L 29/0847* (2013.01); *H01L 29/66522* (2013.01)

(58) Field of Classification Search
None
See application file for complete search history.

(56) References Cited

U.S. PATENT DOCUMENTS

| 10,211,109 | B1* | 2/2019 | Leobandung | ..... H01L 21/02603 |
| 10,236,217 | B1* | 3/2019 | Ando | ................ H01L 29/66545 |
| 2013/0001555 | A1* | 1/2013 | Yin | ................. H01L 21/823425 257/52 |
| 2019/0287864 | A1* | 9/2019 | Cheng | ............... H01L 21/02603 |
| 2019/0333820 | A1* | 10/2019 | Chang | ............... H01L 21/76802 |
| 2020/0027959 | A1* | 1/2020 | Cheng | .................... B82Y 10/00 |
| 2020/0044087 | A1* | 2/2020 | Guha | ................ H01L 29/42392 |
| 2020/0266296 | A1* | 8/2020 | Chu-Kung | ........ H01L 29/66636 |

OTHER PUBLICATIONS

"Fundamentals » Doping: n- and p-semiconductors" by Laube (Year: 2011).*

* cited by examiner

*Primary Examiner* — Evren Seven
(74) *Attorney, Agent, or Firm* — Harness, Dickey & Pierce, P.L.C.

(57) ABSTRACT

Disclosed is a metal source/drain-based field effect transistor having a structure that replaces a portion of a semiconductor of a source/drain with a metal and a method of manufacturing the same. By replacing the source/drain region with the source/drain metal region, increase of the parasitic resistance of a conventional three-dimensional MOSFET of several tens of nanometers, lattice mismatch of the source/drain during selective epitaxial growth, and self-heating effect can be fundamentally solved. Further, since the metal is deposited after the partial etching of the source/drain region or the selective epitaxial growth is partially performed under the conventional CMOS process, the process can be performed without using any additional mask.

25 Claims, 13 Drawing Sheets

[FIG. 1]
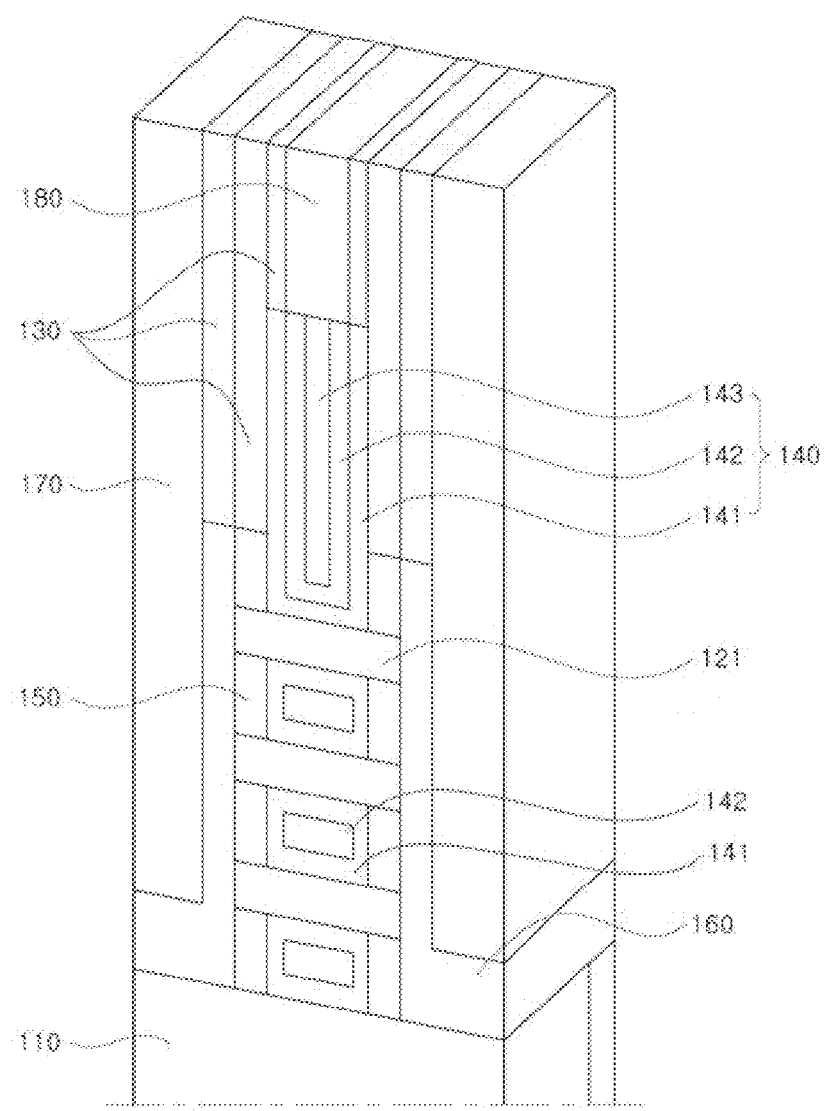

[FIG. 2]
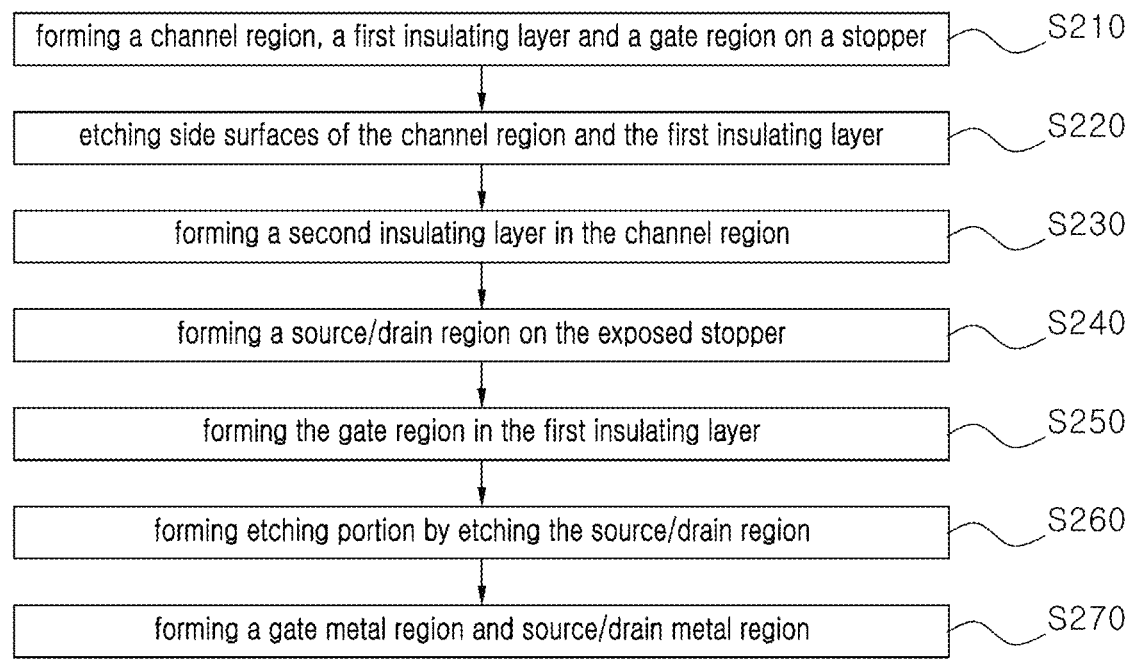

[FIG. 3]
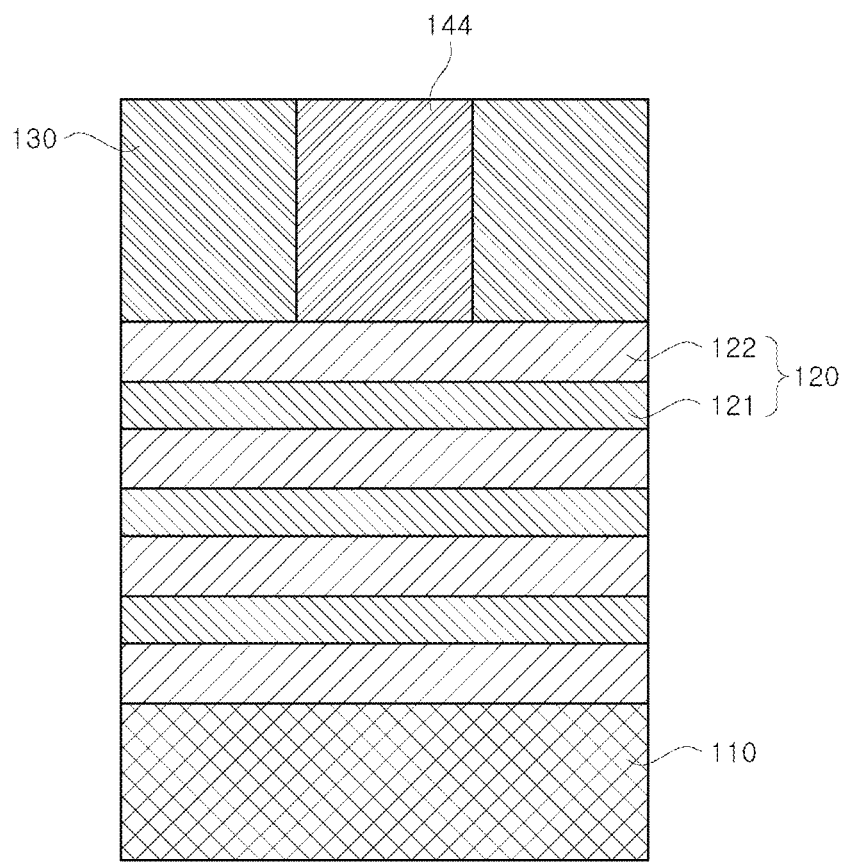

[FIG. 4]
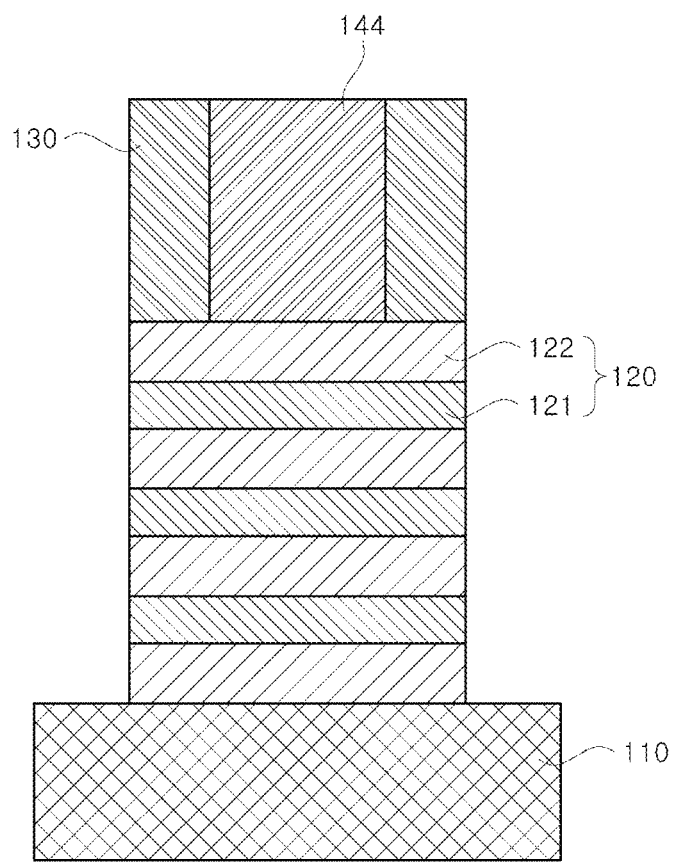

[FIG. 5]
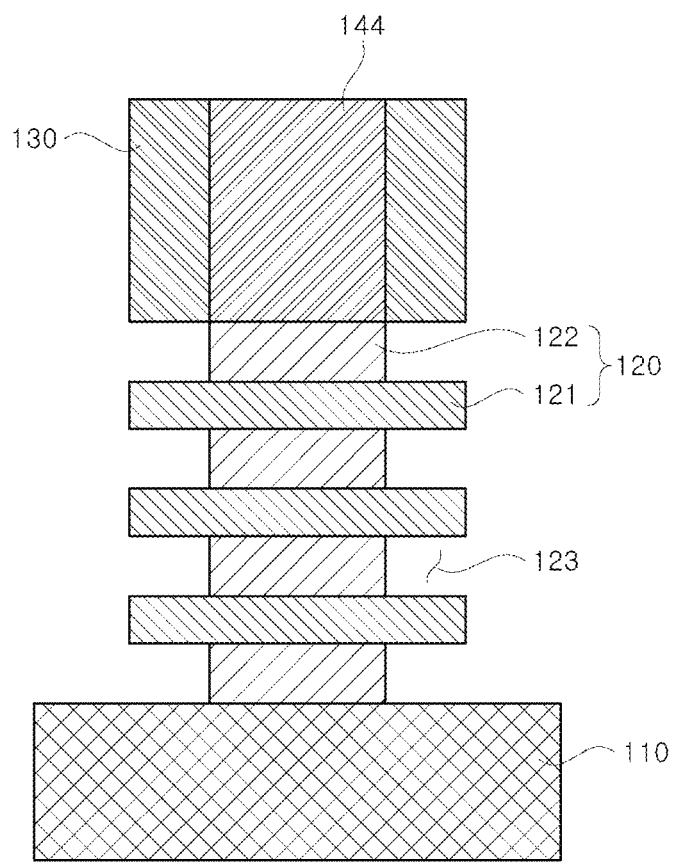

[FIG. 6]
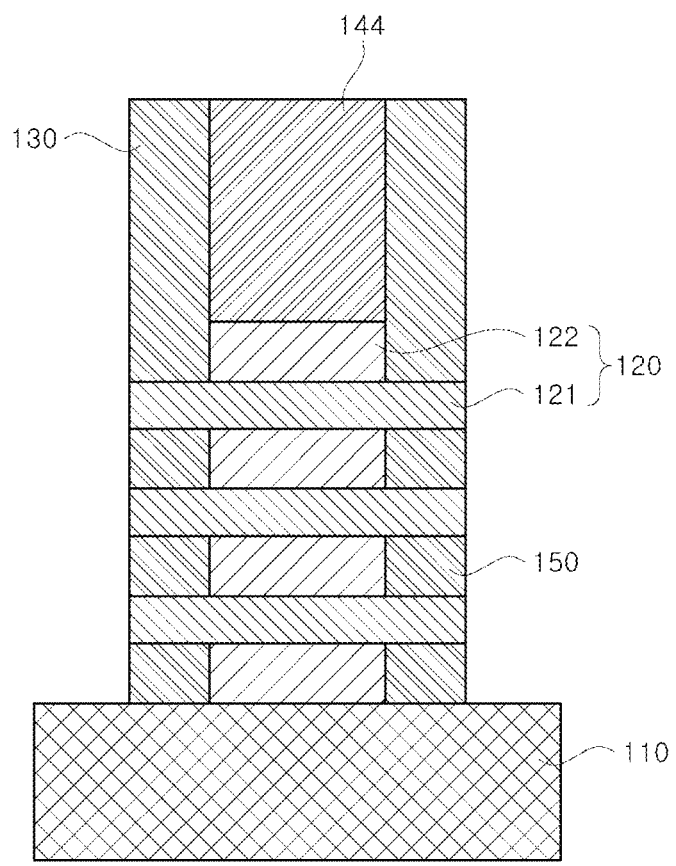

[FIG. 7]
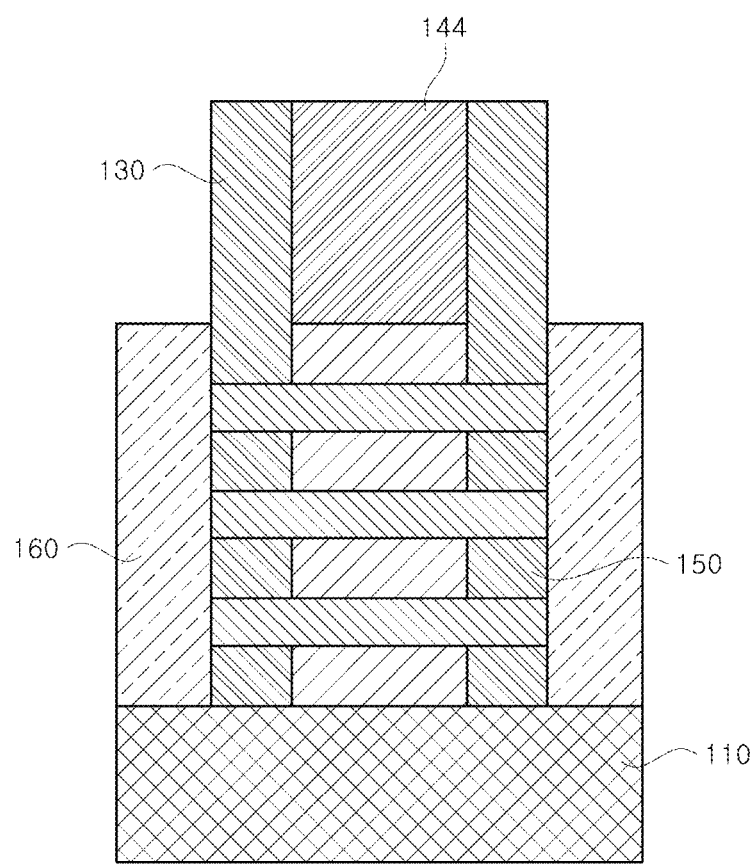

[FIG. 8]
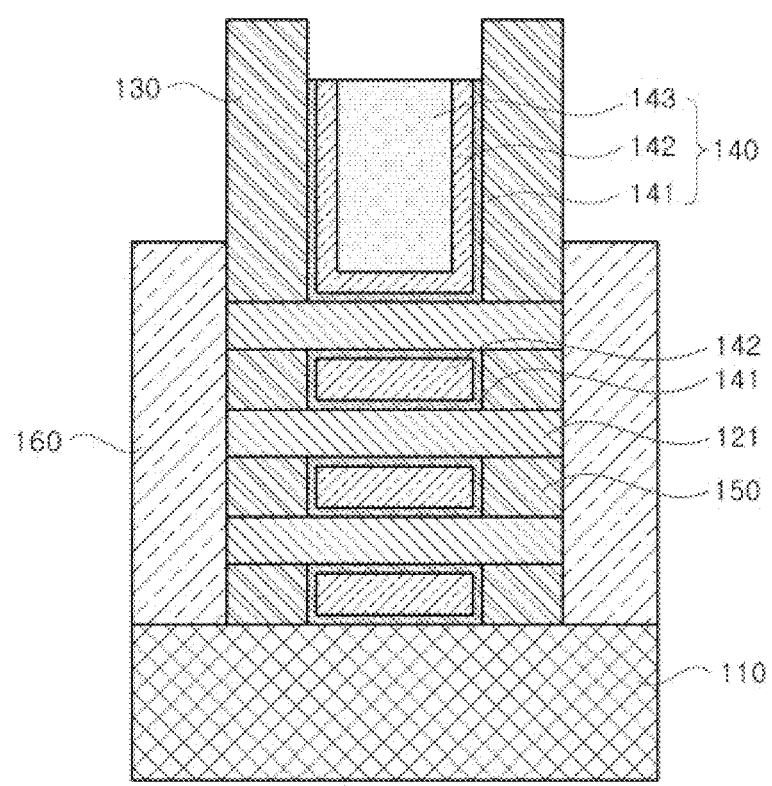

[FIG. 9]
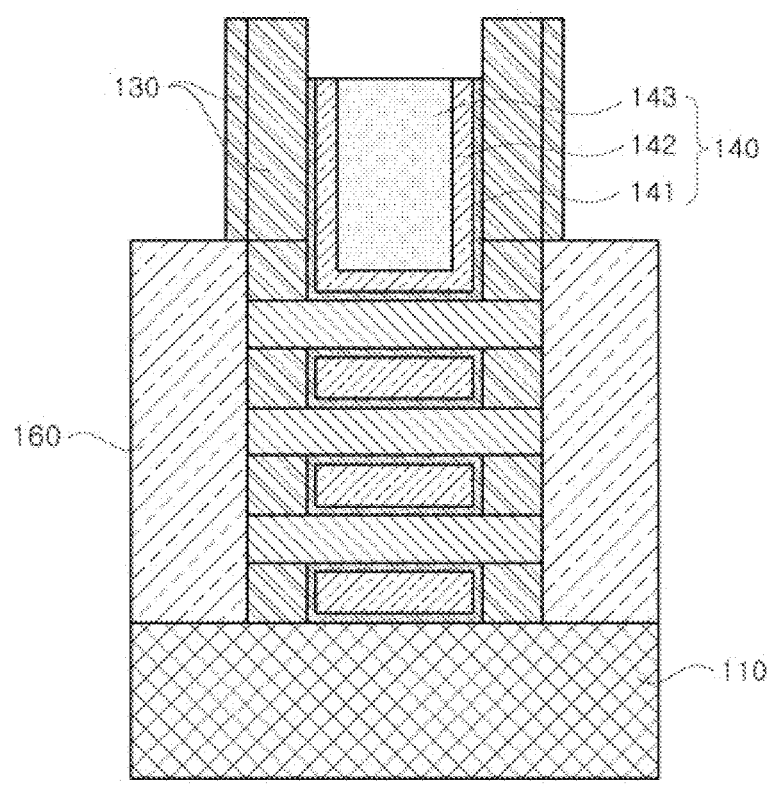

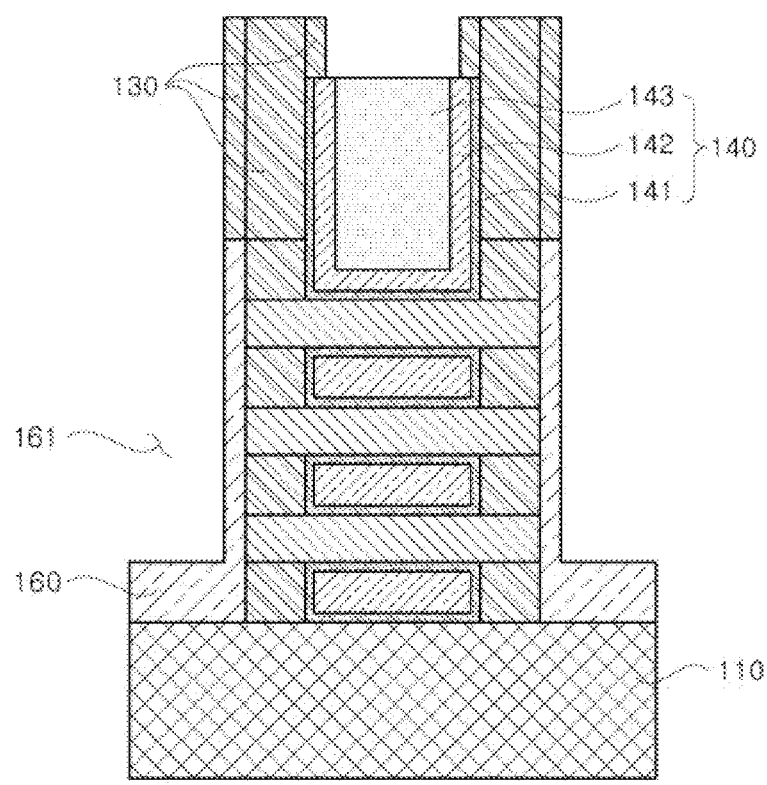
[FIG. 10]

[FIG. 11]
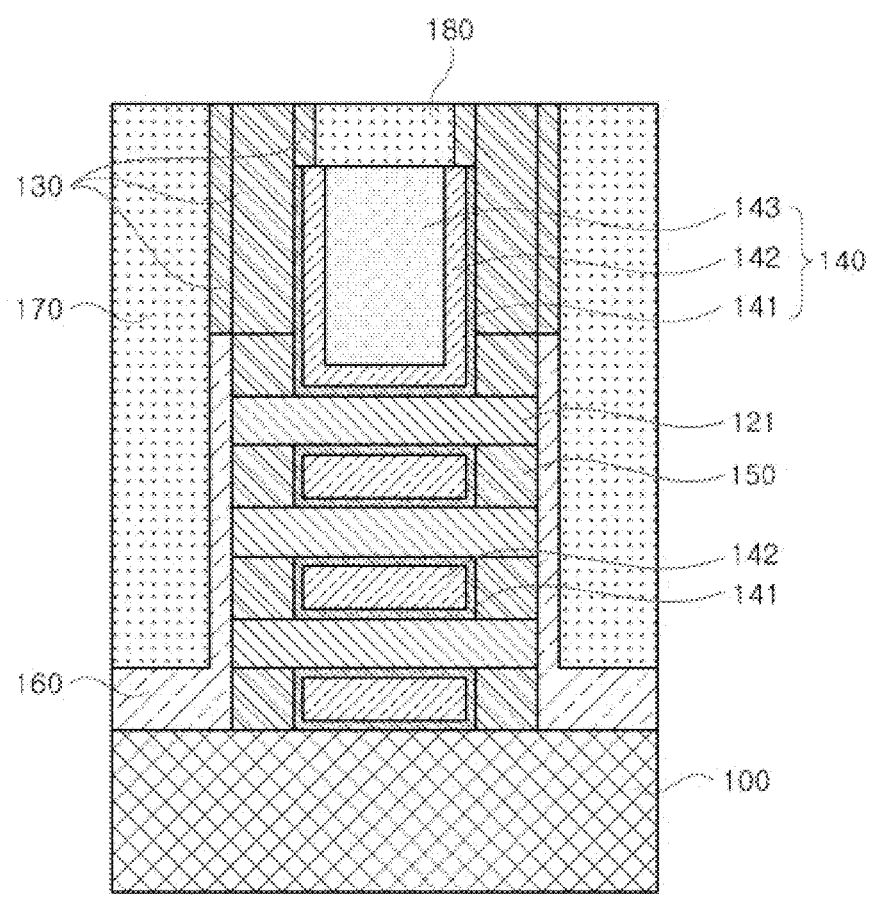

[FIG. 12]
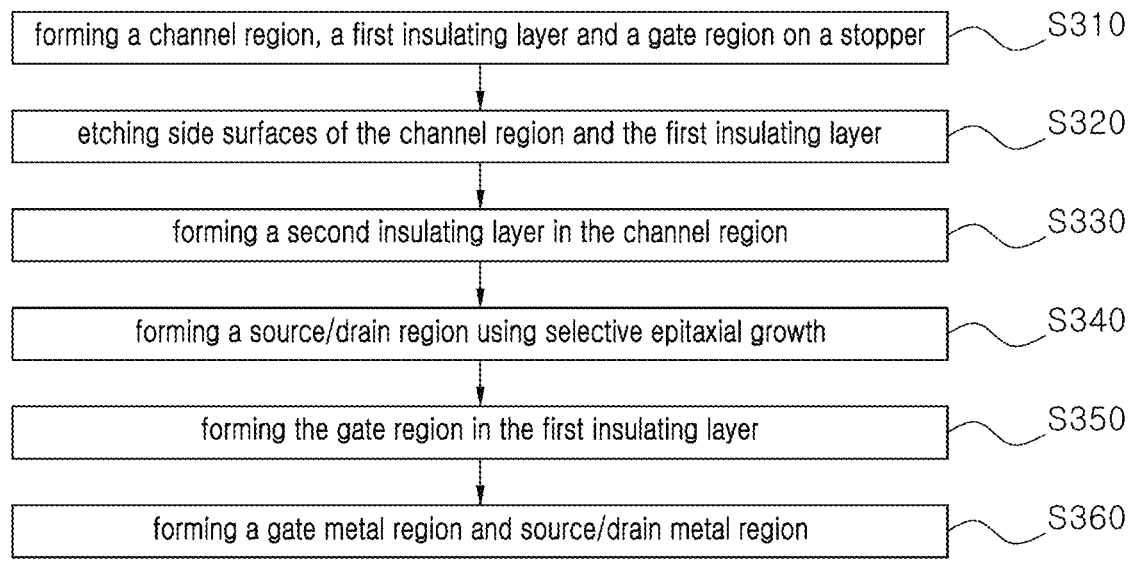
[FIG. 13]
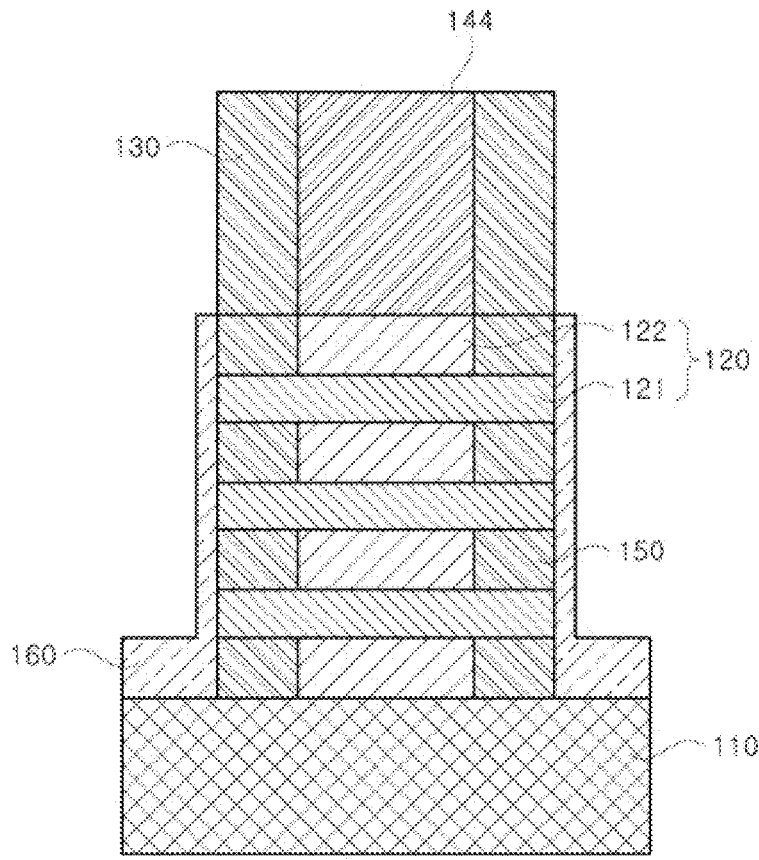

[FIG. 14]
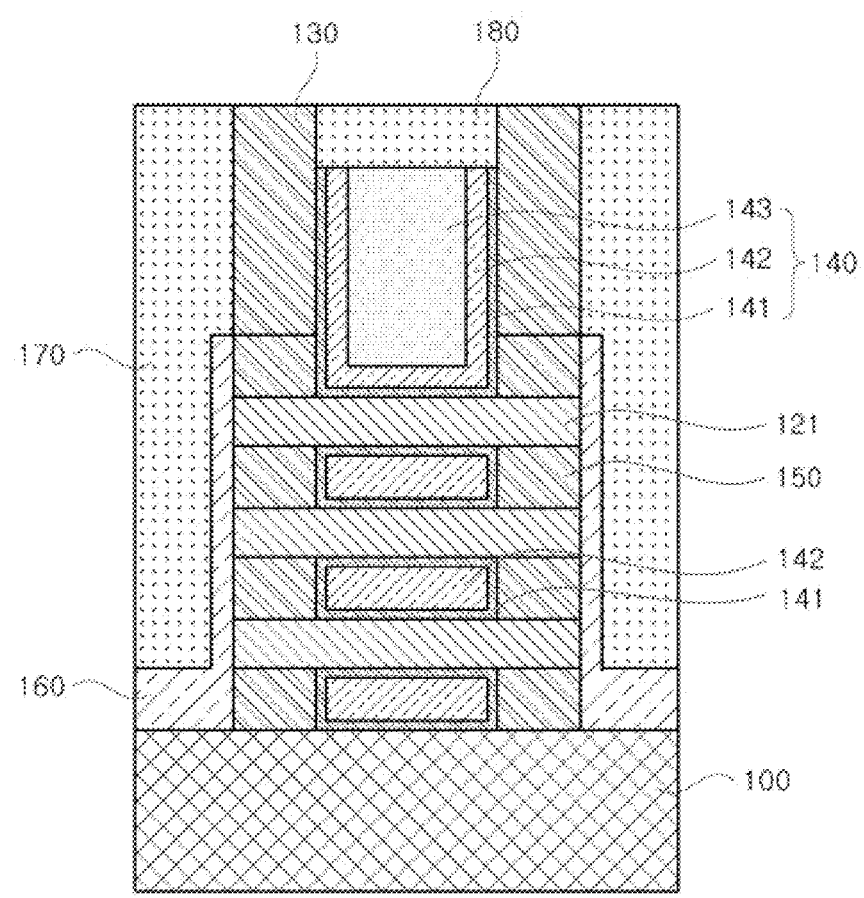

METAL SOURCE/DRAIN-BASED MOSFET AND METHOD FOR FABRICATING THE SAME

TECHNICAL FIELD

The present invention is related to metal source/drain-based metal-oxide-semiconductor field effect transistor (MOSFET) produced by top-down process, more particularly to metal source/drain-based MOSFET and method of manufacturing the same in which a part of source/drain is replaced by metal. In metal source/drain-based MOSFET, it is possible to increase metal/semiconductor contact area of the source/drain while maintaining the channel stresses so that electrical and thermal performances can be improved.

BACKGROUND ART

Metal-oxide-semiconductor field effect transistors (MOSFETs) reduce unit cell cost, increase performance, and reduce power consumption through scaling according to Moore's law. A MOSFET is a device consisting of three terminals that are a source, a drain, and a gate (or substrate). Also, MOSFET is a core device that acts as a switch or amplifier and is used in all the electronic applications such as computers, mobile phones, internet of things, or the like performing logic operations.

The conventional MOSFET reduces the unit area per device and the operation voltage so as to reduce the power consumption, improve the device performance and reduce the process cost at the same time. On the other hand, as the size of the device is reduced to several tens of nanometers, power consumption increases due to the increase of the leakage current flowing under the channel between the source and the drain where the gate cannot control. In order to control the channel between the source and the drain effectively, a fin-shaped FET (FinFET) has been developed by wrapping three sides of the channel. For scaling down to 10 nm, gate-all-around (GAA) FET has also been developed in which the channel can be effectively controlled by the gate surrounding the entire channel region.

However, recently, it has become difficult to scale down MOSFETs by improving gate-to-channel controllability only. Parasitic resistance increases by the reduction of the metal/semiconductor interface area at the source/drain, and the complicated three-dimensional channel structure does not effectively emit heat generated during the device operation, so the device deteriorates greatly. In addition, impurities or heterogeneous materials for stress engineering cause lattice mismatches in the selective epitaxial growth, which results in the formation of a grain boundary and lowers the channel stress. In addition, non-uniform grain boundaries formed by temperature, pressure or composition ratio of substrate cause variability problems.

DISCLOSURE

Technical Problem

The present invention is directed to providing metal source/drain-based FET and method of manufacturing the same. In addition to maintain source/drain engineering techniques that apply stress differently depending on the device type (NMOS, PMOS), lattice mismatch is reduced by decreasing area of source/drain, and parasitic resistance and thermal resistance are reduced by increasing metal/semiconductor junction area of source/drain such that heat generated in device due to self-heating effect is effectively dissipated.

Technical Solution

One aspect of the present invention provides a metal source/drain-based MOSFET having a stopper, a channel layer formed on the stopper, a first insulating layer formed on the channel layer, a second insulating layer formed between the stopper and the first insulating layer, and formed alternatively with the channel layer, a gate formed on the channel layer and formed in the first insulating layer, a source/drain region formed on the stopper and having a side surface contacting the channel layer, and a source/drain metal region formed to contact the source/drain region.

The side surface of the source/drain region is inserted into the first insulating layer.

The side surface of the source/drain region has protruding shape with respect to the channel layer.

The gate has a gate oxide formed to contact the channel layer and the first insulating layer, a metal barrier formed on the gate oxide, and a work function control metal formed to fill interior of the metal barrier.

The metal source/drain-based MOSFET further comprises gate metal region formed on the metal barrier and the work function control metal.

The metal source/drain-based MOSFET further comprises gate metal region formed on the gate oxide, the metal barrier and the work function control metal.

The source/drain region has etching portion formed to accommodate the source/drain metal region.

The source/drain region is composed of silicon, germanium, tin or Group 3-5 compounds, and is formed in crystalline, polycrystalline or amorphous form.

The source/drain metal region has Al, Ti, Cu, Ni or W.

The stopper is doped with p-type impurity that is B, BF2, Al or Ga, or doped with n-type impurity that is P, As or Sb.

The gate is formed at a spaced space between the channel layers.

The second insulating layer is formed in the spaced space between the channel layers, and formed on both sides of the gate Another aspect of the present invention provides a manufacturing method of metal source/drain-based MOSFET having sequentially forming a channel region and a first insulating layer on a stopper and forming a gate region in the first insulating layer, etching side surfaces of the channel region and the first insulating layer such that an upper peripheral portion of the stopper is exposed, forming a second insulating layer in the channel region, forming a source/drain region on the exposed stopper, removing the gate region and forming gate, forming etching portion by etching the source/drain region, and forming a gate metal region on the gate and forming source/drain metal region in the etching portion.

The channel region has channel layer and spacing region that are alternatively formed.

Before forming the second insulating layer, a groove is formed between the channel by removing a side of the spacing region.

The gate has a gate oxide formed to contact the channel region and the first insulating layer, a metal barrier formed on the gate oxide, and a work function control metal formed to fill interior of the metal barrier.

After forming the source/drain region, the first insulating layer is additionally formed on the source/drain region and the gate.

The etching portion is formed such that only the lower surface of the source/drain region in contact with the stopper and the side in contact with the channel portion are left.

The etching portion is formed to expose side surface of the channel region.

In the etching side surfaces of the channel region and the first insulating layer, a material selected from SiO2, SiNx and a metal material such as Cr, Ni or Al is used as an etching mask.

A process of any one of electron beam lithography, nanoimprint, ion beam lithography, X-ray lithography, extreme ultraviolet lithography, photolithography, and process using randomly scattered nanoparticles is used to etch the source/drain regions.

A concentration of impurities doped into the source/drain region has range of $10^{19}$ cm$^{-3}$ to $10^{21}$ cm$^{-3}$.

The forming the gate comprises removing spacing region of the channel region and forming the gate at spaced space between the channel, and the spaced space formed by removing the spacing region.

Still another aspect of the present invention provides a manufacturing method of metal source/drain-based MOSFET having sequentially forming a channel region and a first insulating layer on a stopper and forming a gate region in the first insulating layer, removing side of the channel region and the first insulating layer such that an upper peripheral portion of the stopper is exposed, forming a second insulating layer in the channel region, forming a source/drain region using selective epitaxial growth on the exposed stopper, removing the gate region and forming a gate, and forming a gate metal region on the gate, and forming a source/drain metal region to contact the source drain semiconductor region.

The source/drain region has lower surface contacting the stopper and side surface contacting the channel region.

The source/drain region has side surface contacting the channel region.

Advantageous Effects

According to the present invention, by replacing the source/drain region to the source/drain metal region, the parasitic resistance increase of conventional three-dimensional MOSFETs of several tens of nanometers in size, a lattice mismatching phenomenon of a source/drain in selectively epitaxial growth, and a self-heating effect during a device operation can be fundamentally solved.

In addition, since the source/drain region is further etched or the metal is deposited after the selective epitaxial growth is partially performed without deviating from the conventional CMOS process, the process can be performed without using additional masks. Since the mask for etching the insulator can be utilized before the source/drain metal region is deposited in the conventional MOSFET process, the process cost can be reduced.

Effects of the present invention are not limited to the above-described effects and other unmentioned effects may be clearly understood by those skilled in the art from the following descriptions.

DESCRIPTION OF DRAWINGS

FIG. 1 is view of illustrating a metal source/drain-based FET according to first embodiment of the present invention.

FIG. 2 is a flow chart illustrating a method for fabricating a metal source/drain-based FET according to first embodiment of the present invention.

FIGS. 3 to 11 are views for explaining a method of manufacturing a metal source/drain-based FET according to first embodiment of the present invention.

FIG. 12 is a flow chart illustrating a method for fabricating a metal source/drain-based FET according to a second embodiment of the present invention.

FIGS. 13 and 14 are views for explaining a method of manufacturing a metal source/drain-based FET according to a second embodiment of the present invention.

MODES OF THE INVENTION

Hereinafter, embodiments of the present invention will be described in detail with reference to the accompanying drawings.

While the present invention is susceptible to various modifications and alternative forms, specific embodiments thereof are shown by way of example in the drawings and will herein be described in detail. However, it should be understood that there is no intent to limit the invention to the particular forms disclosed but rather the invention is to cover all modifications, equivalents, and alternatives falling within the spirit and scope of the invention defined by the appended claims.

When an element such as a layer, a region, and a substrate is referred to as being disposed "on" another element, it should be understood that the element may be directly formed on the other element or an intervening element may be interposed therebetween.

It should be understood that, although the terms "first," "second," etc. may be used herein to describe various elements, components, areas, layers, and/or regions, these elements, components, areas, layers, and/or regions are not limited by these terms.

First Embodiment

FIG. 1 is view of illustrating a metal source/drain-based FET according to first embodiment of the present invention.

Referring to FIG. 1, a metal source/drain-based FET according to the present invention has a stopper 110, channel layer 121, first insulating layer 130, gate 140, second insulating layer 150, source/drain region 160, and source/drain metal region 170. The channel layer 121 is formed on the stopper 110, and the first insulating layer 130 is formed on the channel layer 121. The second insulating layer 150 is formed between the stopper 110 and the first insulating layer 130, and is alternately formed with the channel layer 121. The gate 140 is formed on the channel layer 121 and formed in the first insulating layer 130. The source/drain region 160 of which side surface contacts with channel layer 121 and the source/drain metal region 170 is formed to contact with the source/drain region 160.

The stopper 110 may be formed on a silicon substrate. The stopper 110 may be silicon substrate itself or silicon layer deposited and doped at high concentration. In addition to, germanium, tin or Group 3-5 compounds for which that top-down process is possible be may also be used as the stopper 110. The stopper 110 by impurities injected into the silicon substrate may be p-type or n-type. For example, when the stopper 110 is a p-type, it may be formed of BF2, Al, or Ga. When the stopper 110 is an n-type, it may be formed of P, As, or Sb. The impurities injected into the stopper 110 depend on the device type (NMOS, PMOS), and may be p-type for NMOS or n-type for PMOS. For example, it is preferable to inject a high concentration impurity into the stopper 110 so that a leakage current between the source and the drain that the gate 140 cannot control is negligible.

The channel layer 121 and the first insulating layer 130 are sequentially formed on the stopper 110. Here, the first insulating layer 130 may be formed on the channel layer 121 and may cover both sides of the gate 140.

In addition, a second insulating layer 150 may be formed between the stopper 110 and the first insulating layer 130. That is, the second insulating layer 150 may be repeatedly formed with the channel layer 121 between the stopper 110 and the first insulating layer 130.

Here, the first insulating layer 130 and the second insulating layer 150 may be formed of the same material or different materials. The first insulating layer 130 and the second insulating layer 150 may be formed of any one of $SiO_2$, $Al_2O_3$, $HfO_2$, $ZrO_2$, $Si_3N_4$, and perovskite oxide.

The gate 140 is formed on the channel layer 121, and may be formed in the first insulating layer 130 and the second insulating layer 150. That is, the gate 140 may be formed inside the removed first insulating layer 130 by removing the center portion of the first insulating layer 130.

The gate 140 may also include a gate oxide 141, a metal barrier 142, and a work function control metal 143. The gate oxide 141 is formed on the channel layer 121, and both sides of the gate oxide 141 may be formed in contact with the first insulating layer 130 and the second insulating layer 150. The gate oxide 141 may be formed of any one of $SiO_2$, $Al_2O_3$, $HfO_2$, $ZrO_2$, $Si_3N_4$, and perovskite oxide. The metal barrier 142 functions to prevent metal ions of the work function control metal 143 from diffusing into the gate oxide 141. The metal barrier 142 and the work function control metal 143 are sequentially formed on the gate oxide 141.

The gate 140 is also formed in the spaced space between the channel layers 121. That is, the gate oxide 141, the metal barrier 142, and the work function control metal 143 may be formed in the spaced space between the channels. However, the work function control metal 143 may not be shown in the drawings because it is formed on the back portion.

Therefore, the second insulating layer 150 and the gate 140 are formed in the spaced space between the channel layers 121, and the second insulating layer 150 may be formed on both sides of the gate 140.

The source/drain 160 is formed on the stopper 110 and may have a side surface contacting the channel layer 121. The side surface of the source/drain region 160 may be formed to be inserted into the first insulating layer 130, or may be formed to protrude from the channel layer 121. In addition, the source/drain region 160 may be formed such that only the bottom surface contacting the stopper 110 and the side surface contacting the channel layer 121 remain or only the side surface contacting the channel layer 121 remains.

The source/drain region 160 may comprise a high concentration impurity formed using selective epitaxial growth, and the type of impurity may vary depending on the device type (NMOS, PMOS). It may be n-type in the case of NMOS and p-type in case of PMOS. The impurity may be formed of $BF_2$, Al or Ga when the FET is p-type, or P, As, Sb when the FET is n-type. Further, the source/drain region 160 may be formed by using a silicon, a germanium, a tin, a Group 3-5 compound, or the like in order to increase the stress effect of the channel.

The source/drain metal region 170 is formed to contact the source/drain region 160. For example, when the source/drain region 160 is left only at the bottom surface contacting the stopper 110 and the side surface contacting the channel layer 121, the lower portion of the source/drain metal region 170 is in contact with the lower surface of the source/drain region 160, and the side surface of the source/drain metal region 170 is in contact with the side surface of the source/drain region 160 and the first insulating layer 130. Furthermore, when the side surface of the source/drain region 160 is left only on the side where the source/drain region 160 contacts the channel region 120, the lower surface of the source/drain metal region 170 is contact with the stopper 110, and the side surface of the source/drain metal region 170 may be formed to contact the side surface of the remaining source/drain region 160 and the first insulating layer 130.

A gate metal region 180 may be formed on the gate 140. For example, the gate metal region 180 may be formed to contact the gate oxide 141, the metal barrier 142, and the work function control metal 143, or may be formed to contact the metal barrier 142 and the work function control metal 143.

In general, a MOSFET increases the volume of the source/drain region 160 through selective epitaxial growth to maximize the stress effect of the channel. However, as described above, the metal source/drain-based FET according to the present invention is formed by stacking the source/drain metal region 170 so as to partially replace the partially etched source/drain region 160, so that the junction area between the source/drain region 160 and the source/drain metal region 170 can increase to reduce parasitic resistance and effectively emit heat instead of reducing the stress effect of the channel by the source/drain region 160. That is, problems such as an increase in parasitic resistance of a conventional three-dimensional MOSFET having a size of several tens of nanometers, a lattice mismatch between a source and a drain during selective epitaxial growth, and a self-heating effect generated in device operation can be fundamentally solved.

In addition, since a mask for insulator etching can be utilized before the source/drain metal region is deposited in the conventional MOSFET process, the process cost can be reduced.

FIG. 2 is a flow chart illustrating a method for fabricating a metal source/drain-based FET according to first embodiment of the present invention.

FIGS. 3 to 11 are views for explaining a method of manufacturing a metal source/drain-based FET according to first embodiment of the present invention.

Referring to FIG. 2, in fabrication method of a metal source/drain-based FET according to a first embodiment of the present invention, a channel region and a first insulating layer are sequentially formed on a stopper. A gate region is formed in first insulating layer (S210), and side surfaces of channel region and the first insulating layer are removed such that an upper peripheral portion of stopper is exposed (S220). Then, second insulating layer is formed in the channel region (S230), and source/drain region is formed on the exposed stopper (S240). Gate is formed by removing the gate region (S250), and etch portion is formed by removing the source/drain region so as to leave bottom surface contacting the stopper and side surface contacting the channel region (S260). And, gate metal region is formed on the source/drain metal region in the etch portion and gate (S270).

Referring to FIG. 3, a channel region 120, a first insulating layer 130, and a gate region 144 are formed on a stopper 110. The channel region 120 and the first insulating layer 130 are sequentially formed on a stopper 110 formed on a substrate, and a gate region 144 is formed in the first insulating layer 130. The stopper 110 may be formed on a silicon substrate. The stopper may be the silicon substrate itself or separated silicon layer formed by deposition and heavily doping. Further, germanium, tin or Group 3-5 compounds which can be subjected to a top-down process may also be used. The impurities doped into the silicon substrate may be p-type or n-type. For example, it may be formed of BF2, Al, Ga when the stopper is p-type, and may be formed of P, As, Sb when the stopper is n-type. The impurities doped into the stopper 110 depend on the device type (NMOS, PMOS), and may be p-type for NMOS or n-type for PMOS. For example, the stopper 110 is preferably doped with a high concentration of impurities so that leakage current that is not controlled by the gate 140 cannot flow between the source and the drain.

The channel region 120 formed on the stopper 110 may include a channel layer 121 and a spacing region 122. That is, a spacing region 122 is formed on the stopper 110, a channel layer 121 is formed on the spacing region 122, and a spacing region 122 and the channel layer 121 may be sequentially formed alternately.

The first insulating layer 130 is formed on the channel region 120. The first insulating layer 130 may be formed of any one of SiO2, Al2O3, HfO2, ZrO2, Si3N4, and perovskite oxide.

The gate region 144 may be formed in the etched first insulating layer 130 and may be formed of polysilicon. The gate region 144 may be then removed and the gate and gate metal region will be formed in the removed gate region 144.

Referring to FIG. 4, side portions of the channel region 120 and the first insulating layer 130 are etched such that the upper peripheral portion of the stopper 110 is exposed. The channel region 120 and the first insulating layer 130 are partially removed by lithography and etching so that the upper peripheral portion of the stopper 110 is exposed. This is a preparation step for forming a source/drain region on the stopper 110. The lithography can be performed by any one of electron beam lithography, nanoimprint, ion beam lithography, X-ray lithography, extreme ultraviolet lithography, photolithography (stepper, scanner, contact aligner, etc.) or a process using randomly sprayed nanoparticles. As the etching mask material, metal materials such as Cr, Ni, or Al may be used in addition to insulating films such as SiO2 and SiNx.

Referring to FIG. 5, the side surface of the spacing region 122 is removed so that a groove 123 is formed between the channel layers 121 before the second insulating layer is formed.

In order to remove only the side surface of the spacing region 122, the channel layer 121 may be formed of silicon (Si), and the spacing region 122 may be formed of silicon germanium (SiGe). However, germanium (Ge) may also be included in the channel layer 121, but may be formed by varying the content ratio with germanium included in the spacing region 122. Preferably, the germanium included in the channel layer 121 may include a smaller amount of germanium than the germanium included in the spacing region 122. Accordingly, only a spacing region 122 having a higher content of germanium than the channel layer 121 may be selectively etched using an appropriate wet etchant.

That is, only the exposed spacing region 122 can be selectively etched by using the etching rate difference depending on the material composition ratio between the channel layer 121 and the spacing region 122. In order to remove the degradation factors such as the surface state density on the etched surface during the etching process, it is possible to add a process of growing the insulating film using a thermal oxidation process and then removing the spacing region 122 by using the wet etching.

Referring to FIG. 6, the second insulating layer 150 is formed at the removed spacing region 122.

That is, when the etching process is performed on the spacing region 122 and the groove 123 is formed between the channel layers 121, the second insulating layer 150 is formed to fill the groove 123. The second insulating layer 150 may be made of any one material selected from the group consisting of SiO2, Al2O3, HfO2, ZrO2, Si3N4, and perovskite oxide, which are the same materials as the first insulating layer 130.

Referring to FIG. 7, a source/drain region 160 is formed on the exposed stopper 110.

More specifically, the source/drain region 160 may be formed such that a lower surface thereof is in contact with the stopper 110, and a side surface thereof is in contact with the channel region 120 and the first insulating layer 130. The source/drain region 160 may comprise a high concentration impurity formed using selective epitaxial growth, and the type of impurity may vary depending on the device type (NMOS, PMOS). It may be n-type in the case of NMOS and p-type in case of PMOS. The impurity may be formed of BF2, Al or Ga when FET is p-type, or P, As or Sb when FET is n-type. Further, the source/drain region 160 may be formed by using a silicon, a germanium, a tin, a Group 3-5 compound, or the like in order to increase the stress effect of the channel.

In addition, the concentration of the impurity doped into the source/drain region 160 may be in the range of $10^{19}$ cm$^{-3}$ to $10^{21}$ cm$^{-3}$.

Referring to FIG. 8, gate region 144 is removed, and gate 140 is formed.

More specifically, the gate region 144 and the spacing region 122 formed of polysilicon may be removed, and the gate oxide 141, the metal barrier 142 and the work function control metal 143 may be deposited sequentially in the space where the gate region 144 and the spacing region 122 are removed. In this case, the gate 140 may be formed at a position where the spacing region 122 located at the top of the gate region 144 and the spacing region 122 is removed. In addition, the gate oxide 141, the metal barrier 142, and the work function control metal 143 may be sequentially formed in the spaced space between the channel layers 121 from which the spacing region 122 is removed. However, since the work function control metal 143 formed in the spacing region 122 is formed on the rear portion of the spacing region 122, it is not shown in the drawing.

The gate oxide 141 may be formed of any one of SiO2, Al2O3, HfO2, ZrO2, Si3N4, and perovskite oxide.

Referring to FIG. 9, first insulating layer 130 may be further formed on the source/drain region 160 after the gate 140 is formed. The additional first insulating layer 130 is for self-aligned deposition of the source/drain metal region, which will be described later. The first insulating layer 130 is additionally deposited and the region in which the metal is deposited on the gate 140 and the source/drain region through a lithography and etching process is defined. The source/drain region 160 may be inserted into the first insulating layer 130 and the channel region 120 by further forming the first insulating layer 130.

Referring to FIG. 10, an etching portion 161 is formed in the source/drain region 160.

The source/drain metal region 170 may be formed into the etched space by etching one side of the source/drain region 160.

Lithography and etching processes may be used to form the etching portion 161. The lithography can be performed by any one of electron beam lithography, nanoimprint, ion beam lithography, X-ray lithography, extreme ultraviolet lithography, photolithography (stepper, scanner, contact aligner, etc.) and process using randomly sprayed nanoparticles. As the etching mask material, metal materials such as Cr, Ni, and Al may be used in addition to insulating films such as SiO2 or SiNx.

The etching portion 161 is formed to leave bottom surface of the source/drain region 160 contacting stopper 110 and side of the source/drain region 160 contacting the channel region 120, and the height of the source/drain region 160 may be changed by etching. In addition, the bottom of the source/drain region 160 may be removed to leave only the side contacting the channel layer 121. As described above, the reason why the source/drain region 160 heavily doped is etched is to solve the problem of not effectively releasing heat due to the self-heating phenomenon. The self-heating phenomenon is caused by the fact that the unit area of the MOSFET is greatly reduced and the parasitic resistance increases greatly due to the reduction of the junction area between the source/drain region 160 and the source/drain metal region.

The first insulating layer 130 may be further formed on the gate oxide 141 of the gate 140 and the predetermined portion of the metal barrier 142 after the etching portion 161 is formed.

Referring to FIG. 11, a gate metal region 180 is formed on the gate 140 and the source/drain metal region 170 is formed.

First, the source/drain metal region 170 may be formed in the etching portion 161. The source/drain metal region 170 may be formed to be in contact with the source/drain region 160. The source/drain metal region 170 fills the etching portion 161.

For example, when the etching portion 161 is formed so that the source/drain region 160 is left at the bottom contacting the stopper 110 and the side contacting the channel region 120, the lower portion of the source/drain metal region 170 is in contact with surface of the source/drain region 160 and the side surface of the source/drain metal region 170 is in contact with the side surface of the source/drain region 160 and the first insulating layer 130.

For another example, when the etching portion 161 is formed to remove only the lower surface of the source/drain region 160 and to leave only the side contacting the channel region 120, the lower surface of the source/drain metal region 170 may be in contact with stopper 110 and side surface of the source/drain metal region 170 may be in contact with side surface of the source/drain region 120 and the first insulating layer 130.

In addition, the gate metal region 180 may be formed on the gate 140 such that the gate metal region 180 is on contact with the metal barrier 142 and the work function control metal 143.

Depending on the process, a portion of the metal or the semiconductor may be silicidated to cause chemical bonding of the material, which may be performed separately in the step prior to FIG. 11.

As described above, instead of reducing the stress effect of the channel, junction area between the source/drain region 160 and the source/drain metal region 170 can increase to reduce parasitic resistance and effectively emit heat by stacking the source/drain metal region 170 so as to partially replace the partially etched source/drain semiconductor region 160. That is, problems such as an increase in parasitic resistance of a conventional three-dimensional MOSFET having a size of several tens of nanometers, a lattice mismatch between a source and a drain during selective epitaxial growth, and a self-heating effect can be fundamentally solved.

Second Embodiment

FIG. 12 is a flow chart illustrating a method for fabricating a metal source/drain-based FET according to a second embodiment of the present invention.

FIGS. 13 and 14 are views for explaining a method of manufacturing a metal source/drain-based FET according to a second embodiment of the present invention.

Referring to FIG. 12, a method of fabricating a metal source/drain-based FET according to the second embodiment includes sequentially forming a channel region and a first insulating layer on a stopper, and forming a gate region within the first insulating layer (S310). The side surfaces of channel region and the stopper are etched to expose an upper peripheral portion of the stopper (S320), and second insulating layer is formed in the channel region (S330). Then, source/drain region is formed on the exposed stopper by using selective etching (S340), and gate is formed by removing the gate region (S350). Finally, gate metal region in the gate is formed and source/drain metal region is formed to contact the source/drain region (S360).

The manufacturing method according to the second embodiment is the same as the first embodiment until the step of forming the second insulating layer between the channel layers (S330). In the manufacturing method according to the second embodiment, after the second insulating layer is formed, the source/drain region 160 is selectively epitaxially grown on the upper surface of the stopper and on the side surface of channel layer.

Referring to FIG. 13, the source/drain region 160 is formed on exposed stopper 110 by using selectively epitaxial growth.

The source/drain region 160 is not inserted into the first insulating layer 130 and has protruding shape with respect to the channel region 120.

This is because selective epitaxial growth proceeds partly on the upper surface of the stopper 110 and on the side surface of the channel layer 121 in place of formation of the source/drain region 160 shown in FIG. 7 of the first embodiment. So, heavily doped source/drain region 160 may be formed by selective epitaxial growth. That is, the step of additionally forming the first insulating layer 130 on the source/drain region 160 and etching the source/drain region 160 to form the etching portion 161 may be omitted.

Referring to FIG. 14, the gate region 144 is removed and a gate 140 is formed. A gate metal region 180 is formed on the gate 140, and a source/drain metal region 170 is formed to contact the source/drain region 160.

As described above, by replacing the source/drain region 160 with the source/drain metal region 170, increase of the parasitic resistance of conventional three-dimensional MOSFETs of several tens of nanometers in size, a lattice mismatching phenomenon of a source/drain in selectively epitaxial growth, and a self-heating effect occurring during a device operation can be fundamentally solved.

In addition, since the source/drain region 160 is further etched or the metal is deposited after the selective epitaxial growth is partially performed without deviating from the conventional CMOS process, the process can be performed without using additional masks. Since the mask for etching the insulator can be utilized before the source/drain metal region 170 is deposited in the conventional MOSFET process, the process cost can be reduced.

It should be noted that the embodiments of the present invention disclosed in the present specification and drawings are only illustrative of specific examples for the purpose of understanding and are not intended to limit the scope of the present invention. It will be apparent to those skilled in the art that other modifications based on the technical idea of the present invention are possible in addition to the embodiments disclosed herein.

The invention claimed is:

1. A metal source/drain-based MOSFET comprising:
a stopper; a channel layer on the stopper;
a first insulating layer on the channel layer;
a second insulating layer between the stopper and the first insulating layer, and alternatively with the channel layer;
a gate on the channel layer and in the first insulating layer, wherein the gate comprises a gate oxide contacting the channel layer and the first insulating layer;
a source/drain region on the stopper and having a first side surface and a second side surface opposite the first side surface, the first side surface contacting the channel layer; and
a source/drain metal region directly contacting the second side surface of the source/drain region, wherein
a topmost surface of the source/drain region is parallel to a surface of the stopper, at a level above a bottom level of a topmost gate, and directly contacts an overhanging outer portion of the first insulating layer at the level above the bottom level of the topmost gate,
a lowermost surface of the source/drain metal region is located at a level below a top level of a lowermost channel layer, and the first insulating layer further includes an overhanging inner portion that directly contacts a top level of the topmost gate, wherein a top surface of the gate oxide directly contacts a bottom surface of the overhanging inner portion, and
the bottom of the overhanging portion is in direct contact with all of the top surface of the gate oxide.

2. The metal source/drain-based MOSFET of claim 1, wherein the first side surface of the source/drain region is flush with a side surface the first insulating layer.

3. The metal source/drain-based MOSFET of claim 1, wherein the first side surface of the source/drain region has a protruding shape with respect to the channel.

4. The metal source/drain-based MOSFET of claim 1, wherein the gate comprises:
a metal barrier on the gate oxide; and
a work function control metal filling an interior of the metal barrier.

5. The metal source/drain-based MOSFET of claim 4, further comprising:
a gate metal region on the metal barrier and on the work function control metal.

6. The metal source/drain-based MOSFET of claim 4, further comprising:
a gate metal region on the gate oxide, the metal barrier and the work function control metal.

7. The metal source/drain-based MOSFET of claim 1, wherein the source/drain region has an etching portion.

8. The metal source/drain-based MOSFET of claim 1, wherein the source/drain region includes any one of silicon, germanium, tin, and group 3-5 compounds, and is of at least one of a crystalline phase, a poly-crystalline phase, or an amorphous phase.

9. The metal source/drain-based MOSFET of claim 1, wherein the source/drain metal region includes at least one of aluminum, titanium, copper, nickel, and tungsten.

10. The metal source/drain-based MOSFET of claim 1, wherein the stopper includes at least one of a p-type or n-type dopant,
wherein at least one of B, BF2, Al or Ga is included in the stopper in response to the stopper being p-type, and
wherein at least one of P, As or Sb is included in the stopper in response to the stopper being n-type.

11. The metal source/drain-based MOSFET of claim 2, wherein the gate is at a spaced space between the channel layers.

12. The metal source/drain-based MOSFET of claim 1, wherein the second insulating layer is in a spaced space between the channel layers, and on both sides of the gate.

13. The metal source/drain-based MOSFET of claim 1, wherein the source/drain region has an "L"-shaped cross-sectional profile, with a bottom of the "L" directly contacting the stopper and a side of the "L" directly contacting the second insulating layer.

14. The metal source/drain-based MOSFET of claim 1, wherein the source/drain region directly contacts the stopper.

15. The metal source/drain-based MOSFET of claim 1, wherein the channel layer is provided in plurality, each of the plurality of channel layers stacked in a vertical direction perpendicular to an upper surface of the stopper, and
a bottom surface of the source/drain metal region directly contacts the source/drain region at a lower level than a topmost one of the plurality of channel layers.

16. The metal source/drain-based MOSFET of claim 1, wherein the source/drain metal region directly contacts the stopper.

17. The metal source/drain-based MOSFET of claim 1, wherein the source/drain region has a bottom surface directly contacting the stopper.

18. The metal source/drain-based MOSFET of claim 1, wherein a concentration of impurities included in the source/drain region has a range of between $10^{19}$ cm−3 to $10^{21}$ cm−3.

19. The metal source/drain-based MOSFET of claim 1, wherein the source/drain region defines an etching portion, the etching portion having a recessed profile, and
the source/drain metal region fills the etching portion.

20. The metal source/drain-based MOSFET of claim 1, wherein the source/drain metal region includes at least one of aluminum, titanium, copper, or nickel.

21. The metal source/drain-based MOSFET of claim 1, wherein the source/drain metal region has a bottom surface that directly contacts the stopper.

22. A metal source/drain-based MOSFET comprising:
a stopper;
a plurality of channel layers on the stopper;
a first insulating layer directly on a topmost one of the plurality of channel layers;
a plurality of second insulating layers between the stopper and the first insulating layer, and alternatively with the channel layer;
a plurality of gates on the plurality of channel layers and in the first insulating layer, wherein each of the plurality of gates comprise a gate oxide contacting a respective one of the channel layer and the first insulating layer;
a source/drain region directly on the stopper and having a first side surface and a second side surface opposite the first side surface, the first side surface directly contacting each of the plurality of channel layers; and a source/drain metal region directly contacting the second side surface of the source/drain region, wherein a top of an uppermost surface of the source/drain region contacts the source/drain metal region at a level above a bottom surface of a topmost one of the plurality of gates and is above the bottom surface of the topmost one of the plurality of gates, a top of a lowermost surface of the source/drain region, different from the uppermost surface of the source/drain region, contacts the source/drain metal region, the top of the uppermost surface the source/drain region contacts an overhanging outer portion of the first insulating layer at a level above a bottom level of the topmost one of the plurality of gates, a lowermost surface of the source/drain metal region is at a level below a top level of a lowermost one of the plurality of channel layers, the first insulating layer further includes an overhanging inner portion that directly contacts a top level of the topmost one of the plurality of gates, and all top surfaces of the gate oxide of the topmost one directly contacts a bottom surface of the overhanging inner portion, and the top surfaces are planar with a top surface of a gate conductor included in the topmost one of the plurality of gates.

23. The metal source/drain based MOSFET of claim 22, wherein the source/drain region includes a bottom portion directly contacting the stopper.

24. The metal source/drain based MOSFET of claim 1, wherein bottom of the overhanging inner portion is at least partially in direct contact with a metal barrier included in the gate.

25. The metal source/drain based MOSFET of claim 24, wherein the bottom surface of the overhanging inner portion is planar with a bottom surface of a gate metal region.

* * * * *